(12) United States Patent
Allen

(10) Patent No.: US 11,495,702 B2
(45) Date of Patent: Nov. 8, 2022

(54) MULTIPLE LAYER CHARGE-COUPLED PHOTOVOLTAIC DEVICE

(71) Applicant: Aaron Richard Allen, Rochester, NY (US)

(72) Inventor: Aaron Richard Allen, Rochester, NY (US)

(*) Notice: Subject to any disclaimer, the term of this patent is extended or adjusted under 35 U.S.C. 154(b) by 0 days.

(21) Appl. No.: 14/692,398

(22) Filed: Apr. 21, 2015

(65) Prior Publication Data

US 2015/0303341 A1 Oct. 22, 2015

Related U.S. Application Data

(60) Provisional application No. 61/995,831, filed on Apr. 21, 2014.

(51) Int. Cl.
| | |
|---|---|
| *H01L 31/055* | (2014.01) |
| *H01L 31/053* | (2014.01) |
| *H01L 31/054* | (2014.01) |
| H01L 51/44 | (2006.01) |

(52) U.S. Cl.
CPC .......... *H01L 31/055* (2013.01); *H01L 31/053* (2014.12); *H01L 31/054* (2014.12); *H01L 51/447* (2013.01); *Y02E 10/52* (2013.01)

(58) Field of Classification Search
USPC ................................................ 136/243–265
See application file for complete search history.

(56) References Cited

U.S. PATENT DOCUMENTS

| 5,723,877 A * | 3/1998 | Sugawa | H01L 27/14609 250/338.4 |
|---|---|---|---|
| 2011/0011455 A1* | 1/2011 | Ji | B82Y 20/00 136/257 |
| 2011/0126889 A1* | 6/2011 | Bourke, Jr. | H01L 31/055 136/253 |
| 2011/0197959 A1* | 8/2011 | Catchpole | B82Y 20/00 136/256 |
| 2014/0230884 A1* | 8/2014 | Shapira | H01S 3/168 136/247 |

* cited by examiner

*Primary Examiner* — Dustin Q Dam
(74) *Attorney, Agent, or Firm* — Lynne M. Blank, Esq.

(57) ABSTRACT

A structure composed of multiple layers that consist of 7 stages of photon and electron management, enhancement, and conversion for the purposes of photovoltaic applications is described. The invention consists of one or more layers comprised of: 1) an energy dependent up and down conversion layer optimized for a particular wavelength such as infrared; 2) a layer for multiple implementations of light capturing and trapping; 3) a layer for photonic and plasmonic enhancement of captured and trapped light; 4) a layer for converting photons to electrons; 5) a layer for multiplying electrons; 6) a layer for storing generated electrons; and 7) a layer for using electrons for power. One or more layers may serve simultaneous purposes.

17 Claims, 9 Drawing Sheets

MULTIPLE LAYER CHARGE-COUPLED PHOTOVOLTAIC DEVICE

CROSS REFERENCE TO RELATED APPLICATIONS

Reference is made to commonly assigned, U.S. Provisional Patent Application Ser. No. 61/995831 by Allen, filed Apr. 21, 2014 and entitled "MULTIPLE LAYER CHARGE-COUPLED PHOTOVOLTAIC DEVICE", the disclosure of which is incorporated herein by reference.

FIELD OF THE INVENTION

The present invention relates in general to both systems and processes for converting light into useable power. In particular, it relates to devices utilizing the photovoltaic, plasmonic, photonic bandgap, up conversion, down conversion, optical resonance, multiple carrier generation, quantum well storage, and charge-coupling processes to produce useable electric power.

BACKGROUND OF THE INVENTION

The purpose of this invention is to provide readily available solar power day or night at high efficiencies and high powers. Currently solar power suffers from low efficiencies and low powers. Solar energy is increasingly becoming a viable option for useable power. There are various methods for capturing light and generating useful electrons. This patent is novel because it simultaneously combines multiple pathways for increasing photovoltaic efficiency and power. It does so by multiplying the number of photons incident on target, increasing the probability of photon absorption, multiplying the number of electrons created, and both storing and coupling out electrons for power.

PROBLEM TO BE SOLVED

There remains a continuing need for high power, high efficiency solar energy devices. It would be desirable to integrate power storage into these devices so as to avoid the need for batteries, to have high power outputs available for high load applications and peak power usage, and the ability to use such a device or its iterations at night or in light-starved environments, most preferably for infrared since infrared is present day or night.

SUMMARY OF THE INVENTION

The present invention relates to a device comprising a structure having multiple layers comprising seven stages of photon and electron management, enhancement, and conversion for the purposes of photovoltaic applications, wherein, the layers are: 1) an energy dependent up and down conversion layer optimized for a particular wavelength; 2) a layer for multiple implementations of light capturing and trapping; 3) a layer for photonic and plasmonic enhancement of captured and trapped light; 4) a layer for converting photons to electrons; 5) a layer for multiplying electrons; 6) a layer for storing generated electrons; and 7) a layer for using electrons for power. One or more layers may serve simultaneous purposes.

ADVANTAGEOUS EFFECT OF THE INVENTION

The present invention includes several advantages, not all of which are incorporated in a single embodiment. These are wavelength conversion, light trapping, photon capture, photon multiplication, photon trapping, electron creation, electron multiplication, electron storage, electron output, integrated energy storage, use in any light environment, scalability, high power, high efficiency, and portability. The novel aspect of this invention is that it incorporates both gain and energy storage elements into the structure and that it utilizes these features explicitly for solar energy purposes.

DETAILED DESCRIPTION OF THE INVENTION

This description details a structure composed of multiple layers that consist of seven stages of photon and electron management, enhancement, and conversion for the purposes of photovoltaic applications. The invention consists of one or more layers comprised of: 1) an energy dependent up and down conversion layer optimized for a particular wavelength such as infrared; 2) a layer for multiple implementations of light capturing and trapping; 3) a layer for photonic and plasmonic enhancement of captured and trapped light; 4) a layer for converting photons to electrons; 5) a layer for multiplying electrons; 6) a layer for storing generated electrons; and 7) a layer for using electrons for power. One or more layers may serve simultaneous purposes.

This invention utilizes charge coupling and its high quantum efficiencies for solar energy. Once a charge buildup is initiated, the device will run at full power through series, parallel, or other scaling architecture to provide constant and peak power performance at high efficiency. This device increases the number of incident photons through multiple pathways. This device increases the number of useable charge carriers through multiple pathways. This device increases output power through multiple pathways. This device incorporates charge and field storage into itself. This device provides power as charge moves sequentially through an array of quantum wells to an output coupling. This device does all of these things in one structure.

Figure 1:
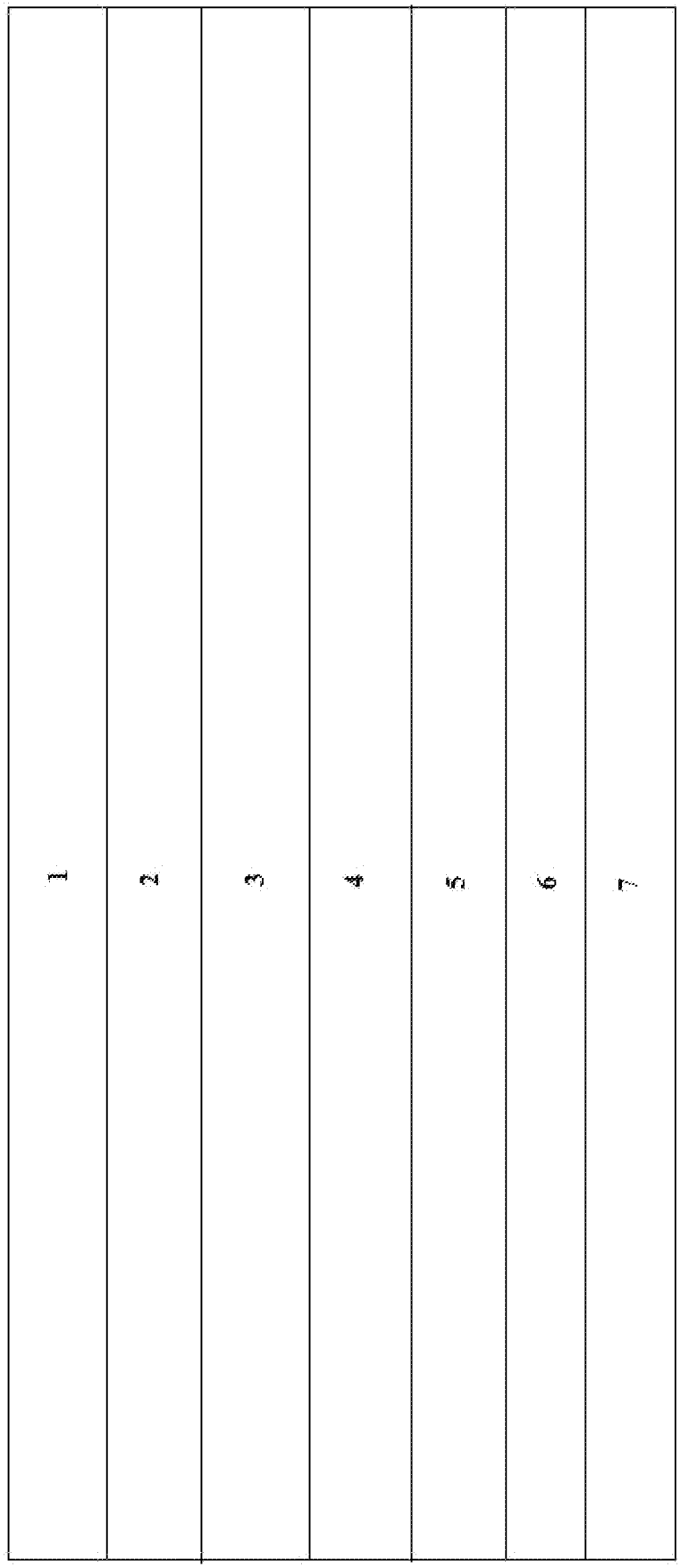
FIG. 1 details a schematic view of the overall structure of a system for storing and producing useable electricity from solar radiation.

FIG. 1 consists of a layer for converting photons 1, a layer for capturing and trapping photons 2, a layer for multiplying photons 3, a layer for converting photons to electrons 4, a layer for multiplying photons 5, a layer for storing electrons 6, and a layer for utilizing electrons for power 7.

Although the preferred embodiment utilizes a seven layer structure, other configurations are possible. Any of the layers can be combined. For example, layer 1 and layer 2 can be combined to form a single layer that comprises an energy dependent up and down conversion sub-layer optimized for a particular wavelength such as infrared in combination with a sub-layer for multiple implementations of light capturing and trapping. Also, layers 2 and 3 can be combined to form a single layer having a sub-layer for multiple implementations of light capturing and trapping in combination with a sub-layer for photonic and plasmonic enhancement of captured and trapped light. In addition, layers 6 and 7 can be combined to form a single layer having a sub-layer for storing generated electrons in combination with a sub-layer for using electrons for power. The possible configurations are simply required to provide the seven functions described above.

Figure 2:
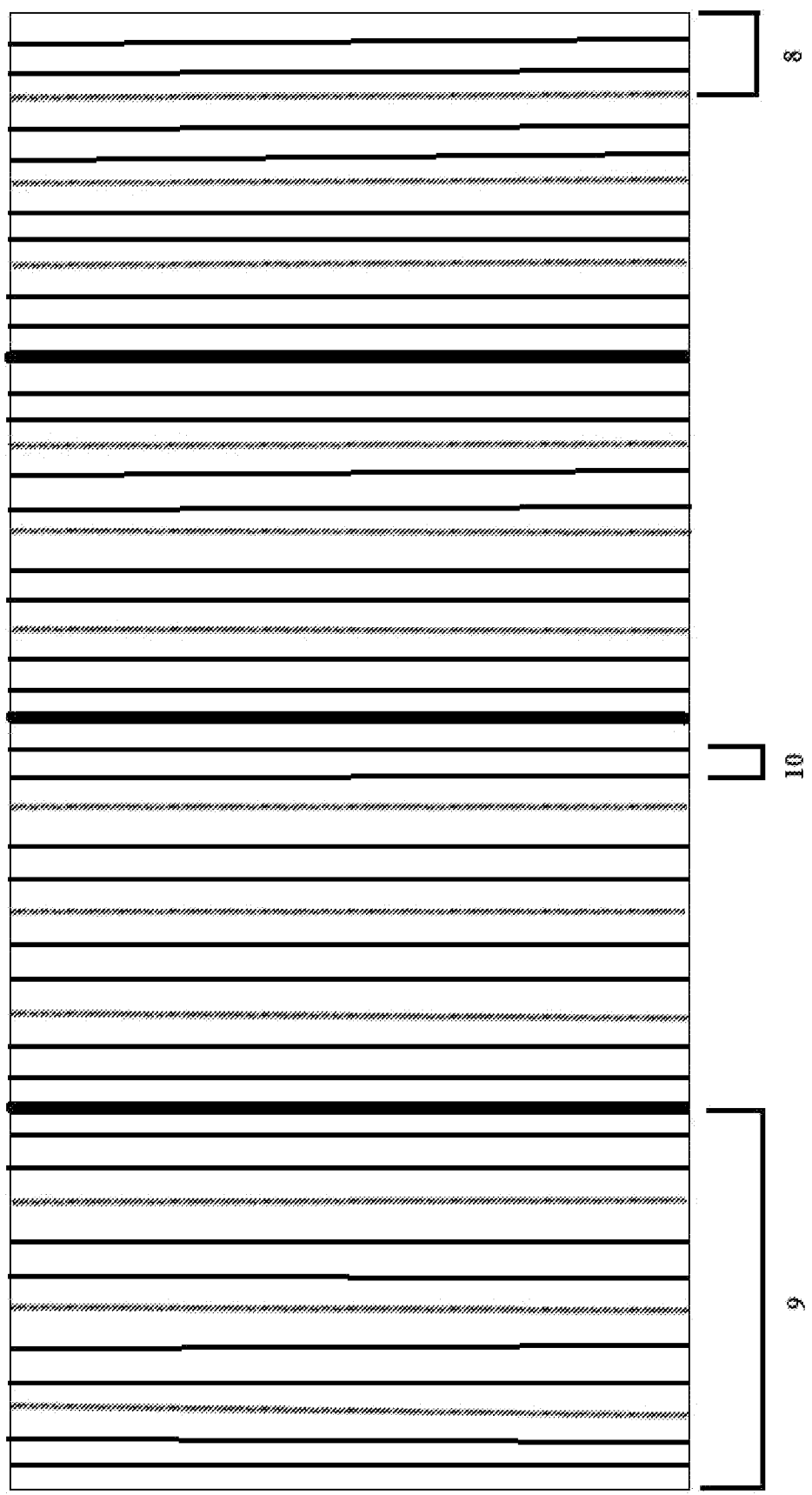
FIG. 2 details a schematic view of a layer system that provides broadband frequency filtering via up conversion and down conversion.

The first layer is an energy dependent up and down conversion layer optimized for a particular wavelength such as infrared. FIG. 2 consists of an energy dependent up and down conversion layer optimized for a particular wavelength through multiple nested periodicities. The periodicity depicted is merely representative. The wavelength optimized for is, for example, but not limited to, infrared. If incident wavelength energy is infrared, it sees a specific periodicity 8 and phase matches through this layer with surface plasmon conditions on plasmon supporting hemispheres 13. See FIG. 4. If incident wavelength energy is below infrared, it sees a different periodicity 9 and up-converts into infrared through phase matching with this layer. If incident wavelength energy is above infrared, it sees yet a different periodicity 10 and down-converts into infrared through phase matching with this same layer. There can be more than three periodicities to account for more incident energies.

In a preferred embodiment, a thin layer made of Ytterbium doped crystal or periodically poled lithium niobate (PPLN/PPKTN) with corrugations that phase match up in energy and different corrugations that phase match down in energy. In this process, the periodicity establishes resonant coupling to propagating waveguide modes. Waveguide modes up convert. Other waveguide modes down convert. Distributed Bragg Reflectors along edges cause transverse cavity effect in this layer.

Preferred materials for this layer can include PPLN or a lanthanide doped glass, to name a few examples.

In another embodiment, a thin layer of dielectric material whose thickness varies transversely from 0 to a thickness of about $\lambda/4n$ (e.g., <100 nm), where $\lambda$ is the wavelength of incident radiation and n is the dielectric material's refractive index. The dielectric layer reflects and/or transmits light at a wavelength that depends on the layer's thickness. Because the dielectric layer's thickness varies, different parts of the dielectric layer may reflect or transmit light at different wavelengths. For instance, shining white light on a dielectric layer with a linearly varying thickness may produce a rainbow-like reflected and/or transmitted beam.

Figure 3:
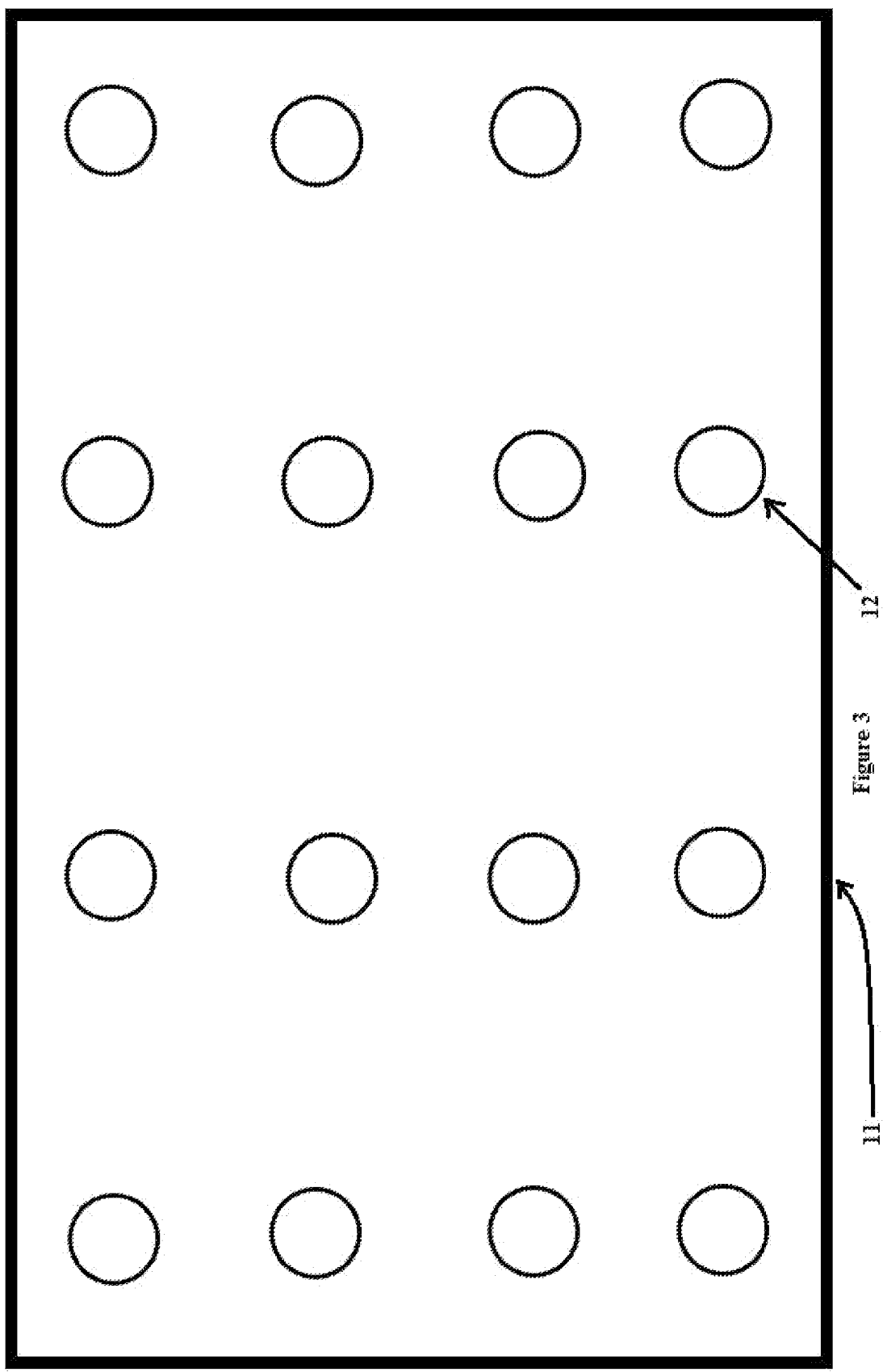
FIG. 3 details a schematic view of a layer system that combines capturing and trapping of light.

The second layer is a layer for multiple implementations of light capturing and trapping. FIG. 3 consists of a photonic crystal layer 11 where the incoming light gets captured and trapped. The light gets localized in Bloch states via photonic crystal periodicity. This periodicity can be of single periodicity, multiple periodicities, or super-lattice configurations. The light slows down through passive nonlinear optical slow light interactions. The light gets reflected from the edges and guided in the transverse direction through a horizontal waveguide effect.

Figure 4:
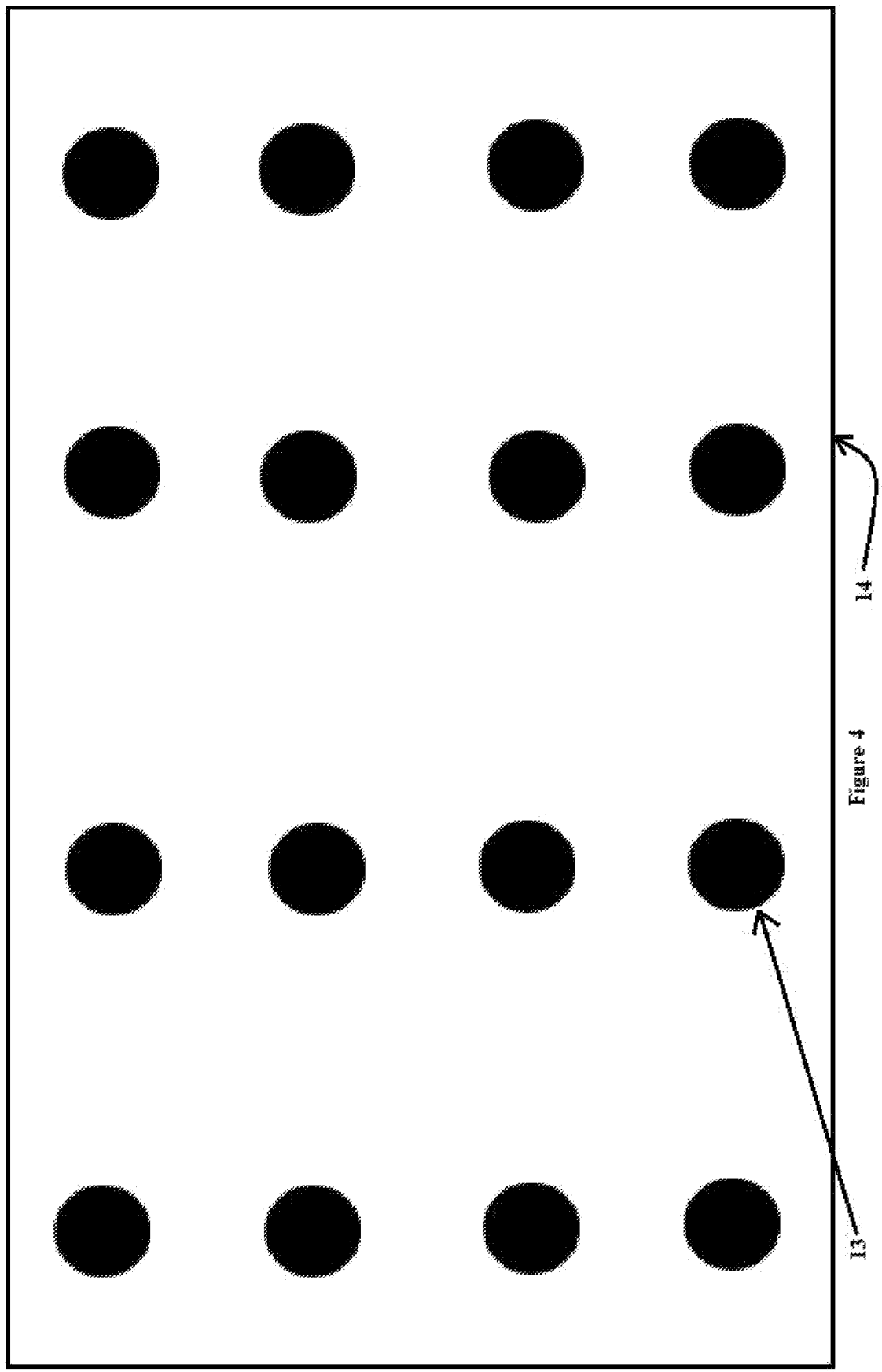
FIG. 4 details a schematic view of a layer system that amplifies light.

FIG. 3 also layers over FIG. 4 such that plasmon supporting hemispheres 13 are present within the photonic crystal holes 12. The tips of the hemispheres are at the same height as the upper edge of the photonic crystal. In this configuration, the incoming light initiates plasmons in the hemispherical material by phase matching with the hemispherical plasmon resonance through the adjacent conversion layer. The created plasmons, in turn, increase the absorption cross section of each photonic crystal hole, as well as the entire photonic crystal structure, capturing more photons. The incident light initiates plasmons in the plasmon supporting hemisphere which in turn, localize the light field in the photonic crystal structure. The incident light also induces Fano resonances that induce regions of high light intensity or hotspots that capture more light.

The photonic crystal layer traps light through localized Bloch states and the slow or stopped light effect. The slow or stopped light increases probability of light capture by plasmon hot spots. As an example of compactness, this may be the same layer as the up conversion layer. This would mean one layer could provide up/down conversion, a cavity effect, and light trapping all at once. The photonic crystal layer can be made from porous silicon.

In some embodiments, the first and second layers can be combined into a single layer.

The third layer is a layer for photonic and plasmonic enhancement of captured and trapped light. FIG. 4 details a layer where all incident light is enhanced. Material 14 is possibly but not necessarily dielectric. It is interspersed with plasmon supporting hemispheres 13 that are placed within the holes 12 (FIG. 3) of the photonic crystal. The incident light acquires intensity by cavity resonances present between the edges of the material that reflect light back and forth between all sides. The incident light acquires intensity through cylindrical waveguide resonances present in the vertical photonic crystal holes.

The incident light also initiates plasmons on the hemispheres, which, in turn, enhances the light field present by increasing the local photonic density of states. The incident light also induces hot spots, where light is intensified. This additional light also creates more plasmons which also cause light enhancement in a manner similar to before. The holes additionally form resonant cavities for the plasmons.

A final mechanism contributing to photon enhancement is Extraordinary Optical Transmission. Electronic multipole moments form standing oscillatory waves on the surface of both the holes and hemispheres. These moments couple strongly to light. In turn, the light creates more plasmons, which in turn capture more light on the surface of the hemispheres and nanoholes. This process greatly increases the number of photons present in the sample.

The material 14 can be a semiconductor or insulator matrix. The hemispheres 13 may be coated on the matrix or embedded therein, for example, so long as contact is made with the photonic crystal holes 12.

The hemispheres can be metal, nanoparticles, or other materials capable of producing plasmons. For example, chemically stable, crystalline, passivated nanoparticles that emit light with high efficiencies and size-tunable and excitation energy tunable color can be used. Preferred nanoparticles can be produced by the thermal degradation of a precursor molecule in the presence of a capping agent at high temperature and elevated pressure. Another preferred nanoparticle is a passivated silicon nanoparticle composition displaying discrete optical transitions.

Another material for the hemispheres can be core/shell resonant light absorption and scattering materials incorporated into active layers for increasing the short circuit current and photo conversion efficiency of organic photovoltaic systems. In particular, resonant light absorption and scattering methods and materials for improving the efficiency and photo conversion efficiency of organic photovoltaic polymer systems (OPV) that include multilayer nanostructures having a noble metal core and a passivated and functionalized outer shell disposed with the active layer of the OPV. Nanospheres and nanorods have been synthesized, characterized and incorporated into the active layers of OPV devices to enhance light absorption through plasmonic light trapping. In some embodiments the peak extinction wavelength of the nanoparticles is designed to coincide with the wavelength region of the OPV band edge in order to ensure that light trapping is occurring at wavelengths of poor absorption. In other embodiments, a second shell consisting of an optically active material is deposited onto the nanoparticles, the material being selected such that the extinction peak of the core of the nanoparticles is designed to coincide with the emission peak of the rare earth energy transition in order to increase the spontaneous emission rate at that wavelength by taking advantage of the Purcell effect.

Figure 5:
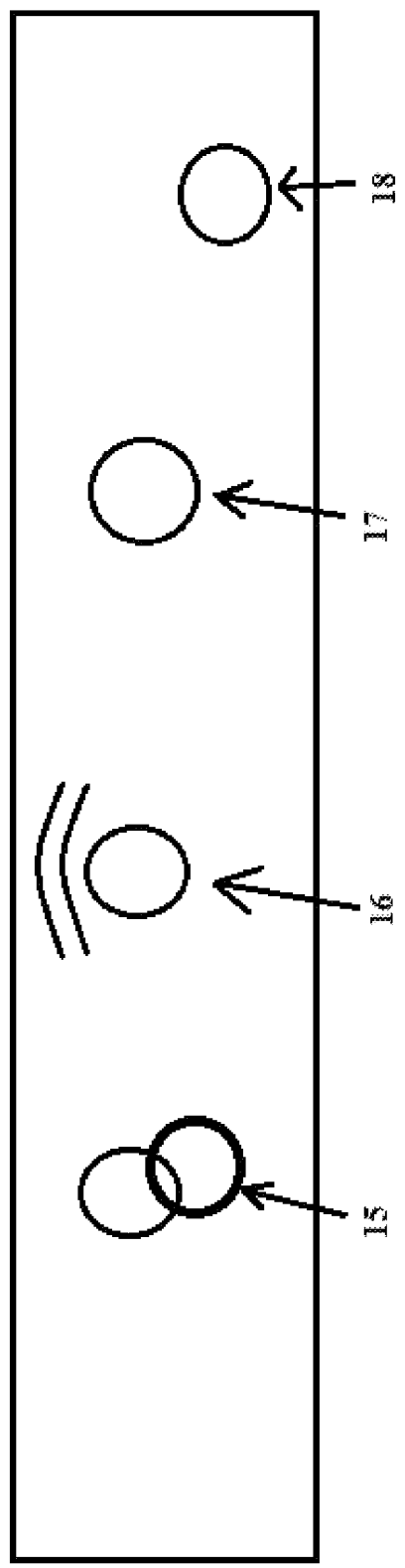
FIG. 5 details a schematic view of a layer system that converts light to charge carriers.

The fourth layer is a layer for converting photons to electrons. FIG. 5 details a layer where photons are converted to electrons. One mechanism is direct bandgap excitation of free electrons in the substrate 18. Another method is indirect bandgap excitation of free electrons in the substrate 17.

Another mechanism is the created plasmons radiatively decay into hot electrons 16. The excitons created also relax into electrons 15.

This layer can be made from a semiconductor material. In fact, any layer can comprise a semiconductor material, with the preferable exception of layer(s) for use as an energy dependent up and down conversion layer optimized for a particular wavelength such as infrared in combination with a layer for multiple implementations of light capturing and trapping, alone or in combination.

In general, the fourth layer comprises a unit that includes a semiconductor and a plasmonic material disposed on the semiconductor, where a potential barrier is formed between the plasmonic material and the semiconductor. The unit further includes an insulator disposed on the semiconductor and adjacent to the plasmonic material and a transparent conductor disposed on the plasmonic material, where, upon illumination, the plasmonic material is excited resulting the excitation of an electron with sufficient energy to overcome the potential barrier.

In another embodiment, the fourth layer can be a silicon structure having a surface layer that is doped with sulfur inclusions with an average concentration in a range of about 0.5 atom percent to about 1.5 atom percent. The surface layer forms a diode junction with an underlying portion of the substrate. The structure exhibits a responsivity greater than about 1 A/W for incident wavelengths in a range of about 250 nm to about 1050 nm, and a responsivity greater than about 0.1 A/W for longer wavelengths, e.g., up to about 3.5 microns.

The fourth layer can also have a silicon substrate comprised of a semiconductor of a first conductivity type, having a first principal surface and a second principal surface opposed to each other, and having a semiconductor layer of a second conductivity type formed on the first principal surface side; In the silicon substrate, an accumulation layer of the first conductivity type having a higher impurity concentration than the silicon substrate is formed on the second principal surface side and an irregular asperity is formed in a region opposed to at least the semiconductor region, in the second principal surface. The region where the irregular asperity is formed in the second principal surface of the silicon substrate is optically exposed.

In one embodiment, for example, the photon converting fourth layer can include a semiconductor substrate having multiple doped regions forming at least one junction, and a textured region coupled to the semiconductor substrate and positioned to interact with photons. The textured region is operable to facilitate generation of an electrical signal from the detection of infrared electromagnetic radiation. Interacting with photons further includes increasing the semiconductor substrate's effective absorption wavelength as compared to a semiconductor substrate lacking a textured region. The quantum efficiency enhanced infrared light region is a textured region located at the device surface.

The photo converting material for use in the fourth layer for the conversion of infrared radiation in a wavelength range such as 400 to 1000 nanometers can consist of a semiconductor substrate with a highly doped interaction volume for the incoming radiation.

Figure 6:
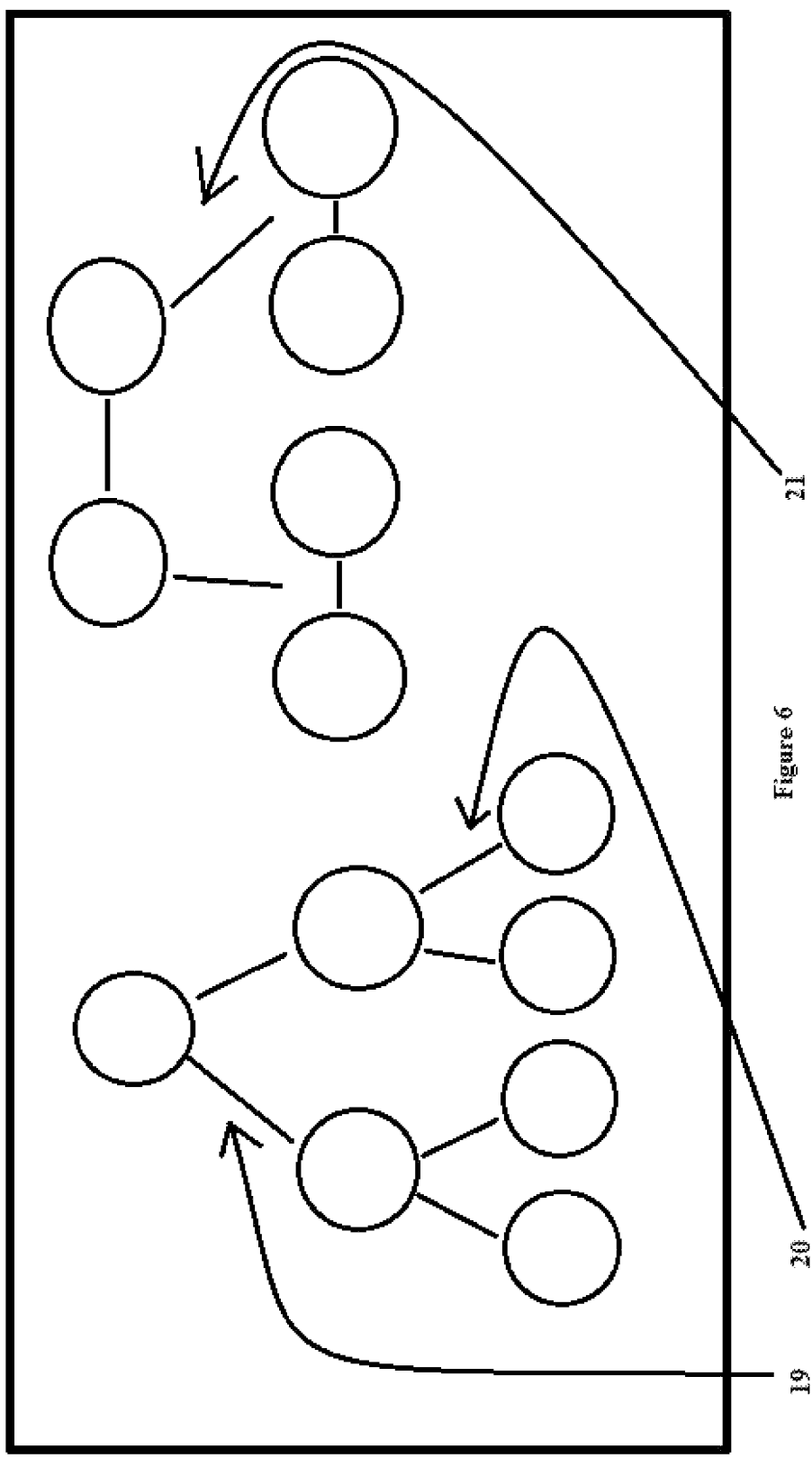
FIG. 6 details a schematic view of a layer system that amplifies current

The fifth layer is a layer for multiplying electrons. FIG. 6 details a layer where the electrons created in FIG. 4 are multiplied. One method of carrier multiplication is through multi-exciton generation 21. The structure can be engineered against dielectric breakdown. Another method is through impact ionization in the bulk 19. An additional though related mechanism is through avalanche ionization 20.

This particular layer can be made from PbSe, PnS, CdSe, InAs, or Si.

The fifth layer can include a first region formed of one type of semiconductor material of one type of conductivity, an adjacent and contiguous second region formed of another type of semiconductor material of opposite conductivity type forming a heterojunction with the first region, the second region being more heavily doped than the first region, a third region of semiconductor material adjacent to and contiguous with the second region and having the same type of conductivity as the first region, the forbidden band gap of the first semiconductor material forming the first region being at least twice as large as the forbidden hand gap of the second semiconductor material forming the second region, for providing minority carriers injected from the first region into the second region with sufficient energy to produce secondary minority carriers in the second region.

Figure 7:
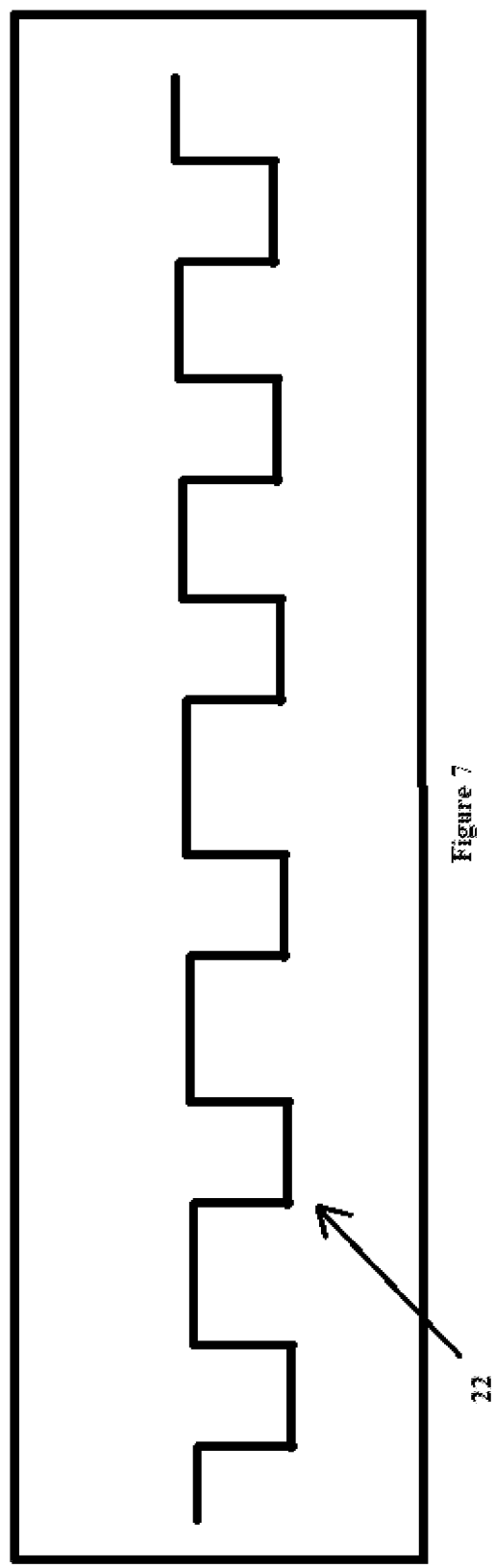
FIG. 7 details a schematic view of a layer system that stores charge.

The sixth layer is a layer for storing generated electrons. FIG. 7 details a layer where electrons, which have been created and multipled, are stored. These electrons are stored in quantum wells 22. These quantum wells are kept at different potentials where sweeping said potentials in a certain sequence causes the electrons to move within a one-dimensional or two-dimensional array.

In an additional configuration, charge can be further amplified using an electron multiplying charge coupled device (CCD) technique where the second voltage is dropped significantly enough to cause impact ionization. On the order of several hundred quantum wells utilizing electron multiplying protocols will allow for substantial increases in power output and overall photovoltaic efficiency. All though this usage is similar to the process used in CCD imaging, where low levels of light are contained to make an image, here the technique is used for power, coupling out the charge to provide power. The benefits are high efficiency operation.

Any typical CCD material can be used such as a metal oxide semiconductor.

The sixth layer can include a three-terminal high voltage semiconductor device, a charge distribution structure and a static discharge system. The charge distribution structure has a plurality of conductors with a floating potential. The charge distribution structure is coupled to a first terminal of the semiconductor device. The static discharge system removes charge that accumulates on at least a subset of the conductors. The static discharge system removes the charge that accumulates on the subset of conductors when the semiconductor device is in a first state while allowing charge to accumulate on the subset of conductors when the semiconductor device is in a second state.

In another embodiment, the sixth layer can be an n type semiconductor substrate having a first principal surface and a second principal surface opposed to each other, and having a $p^+$ type semiconductor region formed on the first principal surface side. At least a region opposed to the $p^+$ type semiconductor region in the second principal surface of the $n^-$ type semiconductor substrate is irradiated with a pulsed laser beam to form an irregular asperity. After formation of the irregular asperity, an accumulation layer with an impurity concentration higher than that of the $n^-$ type semiconductor substrate is formed on the second principal surface side of the n type semiconductor substrate. After formation of the accumulation layer, possibly, the $n^-$ type semiconductor substrate is subjected to a thermal treatment.

In layer 6, the active layer can have one or more quantum confinement species, such as quantum dots, quantum particles, quantum wells, nanoparticles, nanostructures, nanowires and nanofibers. The solid state energy storage device can have a charge rate of at least about 500 V/s and an energy storage density of at least about 150 Whr/kg. In one embodiment, the energy storage layer can comprise an active layer disposed between conductive electrodes.

In one embodiment, at the edge of a highly doped semiconductor region, an extended gate electrode is placed consisting of a conducting material on top of an insulating layer. On the other side of the gate electrode, another highly doped semiconductor region is placed, acting as a charge collector. Through free carrier absorption in the interaction volume, incoming photons impart their energy on mobile charge carriers. In the case of free electrons, the gate electrode is biased slightly below the reset voltage of the interaction volume, so that the electrons carrying the additional energy of the absorbed photons can predominantly make the transition from the interaction volume across the gate electrode area to the charge collector volume, whose potential has been set sufficiently high so that the collected free electrons remain in this semiconductor region. The collected free charge carriers are electronically detected with known circuits for the measurement of electric current or charge packets. A multitude of such infrared photon detecting devices can be arranged in one- or two-dimensional arrays.

Figure 8:
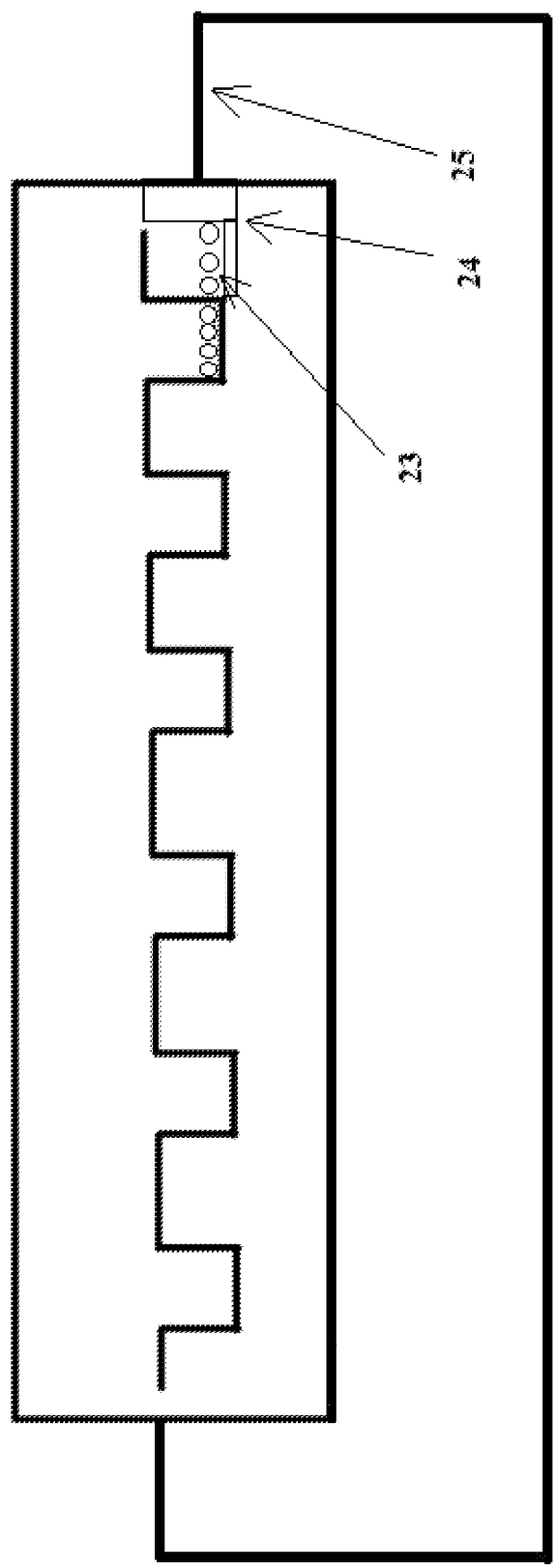
FIG. 8 details a schematic view of a layer system that provides electrical power.
Figure 9:
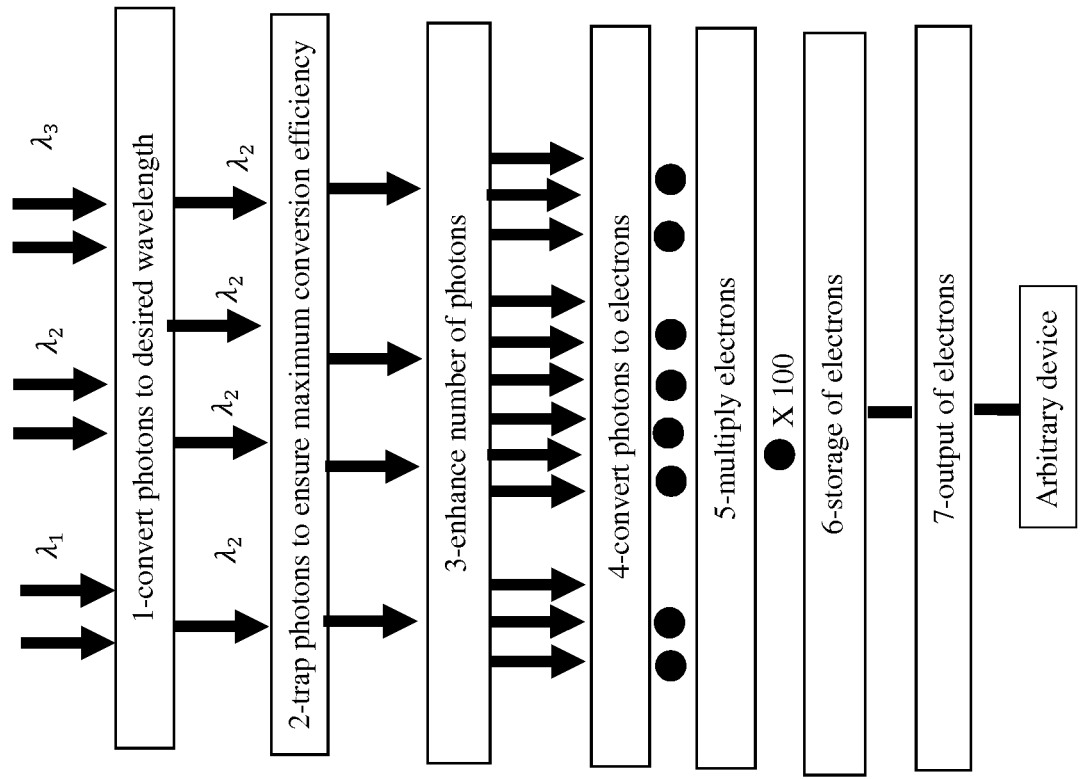
FIG. 9 shows the overall process of the device and how the device manages photons and electrons from sunlight into actual use.

The seventh layer is a layer for using electrons for power. FIG. 8 details a layer where electrons are used for power. 23 shows voltage-controlled electronic tunneling. 24 shows a current collector where charge is collected to be used. 25 shows a current output coupler to be used for power connections. Controlled tunneling can be implemented in various ways, including voltage-controlled. There is also possibility for entangled quantum wells and quantum engine implementations of energy storage and usage. The seventh layer, upon receiving electrons from the sixth layer, outputs its electrical power all at once, gradually, or in stages.

The entire system can run without external power by utilizing a few quantum wells solely to apply voltages to the other wells at times controlled by logic or quantum logic. Some wells will apply voltages for charge movement between wells. Other wells will apply voltages to induce tunneling. The rest of the wells provide storage, amplification, and sourcing of electrical power to external devices. In this configuration, the system is completely self-contained.

When the temperature of this final semiconductor layer is lowered to its operating temperature, the seventh layer is forward biased. During forward biasing of the semiconductor layer, injection of a majority carrier current takes place through the semiconductor layer. The majority carriers mask a part of the defects of the semiconductor layer. The acquisition phase is then performed by reverse biasing the semiconductor layer.

The seventh layer, in yet another embodiment, includes a substrate and a first active layer disposed over the substrate. The semiconductor device also includes a second active layer disposed on the first active layer such that a lateral conductive channel arises between the first active layer and the second active layer, a source, gate and drain contact are disposed over the second active layer. A conductive charge distribution structure is disposed over the second active layer between the gate and drain contacts. The conductive charge distribution structure is capacitively coupled to the gate contact.

Additionally, an electrical transfer element is coupled to the semiconductor substrate and is operable to transfer an electrical signal from at least one junction.

In the seventh layer, among other things, one or more systems and/or techniques for integrating electrical charge are provided. The integration begins during a resting period between a first and second pulse and ends before the second pulse is emitted. Electrical charge that is measured during a resting period is integrated, while electrical charge measured during a pulse is not integrated. In this way, parasitic contributions caused by the direct interaction of radiation photons with a photodiode are reduced and a quantum efficiency of the indirect conversion detector array is increased, for example. Moreover, the period of integration can be adjusted such that a voltage gain related to the indirect conversion detector array can be varied to a predetermined level.

The device according to the present invention is intended to be a self-powered portable electronic device that has the capacity to generate its own electrical power, store electrical charge, and distribute electrical power to similarly designed devices in close proximity. The devices can comprise components including, control processors, data storage, energy storage, dedicated energy and power management processors, and thermo-photovoltaic cells that convert thermal energy into electrical power. The devices are capable of transmitting and receiving energy, power, voice and data information using standard frequencies associated with portable devices. Additionally, the invention can be utilized with methods, systems, and apparatuses comprising circuitry that can control power generation from multiple thermo-photovoltaic cells and traditional power sources.

The preferred inventive device, when fabricated, can be placed into an electrically insulated box, like glass, with electrical contacts placed on the last layer for power output. These contacts can be soldered as a type of power outlet connection for everyday use.

The preferred inventive device and related devices disclosed herein can be used in land vehicles such as cars, motorcycles, and trucks. It can also be used for any type of building, stadium, or house. To scale for power, simply add multiple devices in series or parallel, depending on needs. It can be used industrially for oil rigs, mining, and related occupations. It can be used in aquatic vehicles like boats, ships, and yachts. It can be used in aircraft, spacecraft, and satellites. It can be used for home and personal electronics. Any where there is need for power day or night in any environment, this is applicable.

Each layer can be made via atomic layer deposition, where one puts an activating material in the desired shape of each structure. For nanoholes in the light enhancement layer, this process can be followed by lithographic etching.

A layer can be doped to provide, for example, improved passivation by quantum exclusion. The multilayer doping includes at least two doped layers fabricated using MBE methods. The dopant sheet densities in the doped layers need not be the same, but in principle can be selected to be the same sheet densities or to be different sheet densities. The electrically active dopant sheet densities are quite high, reaching more than $1 \times 10^{14}$ cm$^{-2}$, and locally exceeding $10^{22}$ per cubic centimeter. It has been found that silicon detector devices that have two or more such dopant layers exhibit improved resistance to degradation by UV radiation, at least at wavelengths of 193 nm, as compared to conventional silicon p-on-n devices.

To test the device, a method for evaluating a solar cell incorporated into a solar module is disclosed. A PL evaluation step is performed. The PL evaluation step is a step for evaluating the solar cell to be evaluated among a plurality of solar cells by illuminating the solar cell with light from a light source and detecting the intensity of photo-luminescent light emitted by the solar cell. The light is irradiated while a light-blocking member is provided between the solar module and the light source so that light from the light source is not incident on portions of the solar module other than the solar cell to be evaluated.

Another useful evaluation device is a high-speed Quantum Efficiency (QE) measurement device that includes the present invention, at least one conditioned light source with a less than 50 nm bandwidth, where a portion of the conditioned light source is monitored. Delivery optics are provided to direct the conditioned light to the present invention, a controller drives the conditioned light source in a time dependent operation, and at least one reflectance measurement assembly receives a portion of the conditioned light reflected from the present invention. A time-resolved measurement device includes a current measurement device and/or a voltage measurement device disposed to resolve a current and/or voltage generated in the present invention by each conditioned light source, where a sufficiently programmed computer determines and outputs a QE value for the present invention according to an incident intensity of at least one wavelength of from the conditioned light source and the time-resolved measurement.

There are no particular restrictions on types of material used or their method of production except that they each exhibit the characteristics of converting, capturing, and multiplying light; and converting, multiplying, storing, and using electrons. There is also no fundamental restriction to 7 layers. More layers may be used for an equivalent implementation of this device. Fewer layers may be used for an equivalent implementation of this device.

The invention has been described in detail with particular reference to certain preferred embodiments thereof, but it will be understood that variations and modifications can be effected within the spirit and scope of the invention.

Information from the following references may be additionally descriptive of the invention and are incorporated herein by reference in their entirety:

*Upconversion in solar cells*, van Sark et al. Nanoscale Research Letters 2013, 8:81;

*Materials Aspects of Photonic Crystals*, C. Lopez, Adv. Mater. 2003, 15, No. 20, October 16;

*Multiorder nonlinear diffraction in frequency doubling processes* OPTICS LETTERS/Vol. 34, No. 6/March 15, 2009;

*Lanthanides in Solar Energy Conversion*, Handbook on the Physics and Chemistry of Rare Earths, Vol. 44;

Nanostructures for Photon Management in Solar Cells, Narasimhan and Cui, DOI 10.1515/nanoph-2013-0001;

*Plasmonic Particle Arrays on Large Areas for Photon Management*, Juchter et al, 28$^{th}$ European PV Solar Energy Conference and Exhibition, 30 Sep.-4 Oct., 2013, Paris, France;

*Slow-light-enhanced upconversion for photovoltaic applications in one-dimensional photonic crystals*, Johnson et al, OPTICS LETTERS/Vol. 36, No. 20/Oct. 15, 2011;

*Synergistic plasmonic and photonic crystal light-trapping: Architectures for optical up-conversion in thin-film solar cells*, Le and John, 13 Jan. 2014 | Vol. 22, No. S1 | DOI:10.1364/OE.22.0000A1 | OPTICS EXPRESS A1;

*Near-IR Quantum Cutting Phosphors: A Step Towards Enhancing Solar Cell Efficiency*, Jahav et al, Applied Science and Convergence Technology Vol. 23 No. 5, September 2014, pp. 221~239;

W.G.J.H.M. van Sark, A. Meijerink and R.E.I. Schropp (2012). *Solar Spectrum Conversion for Photovoltaics Using Nanoparticles, Third Generation Photovoltaics*, Dr. Vasilis Fthenakis (Ed.), ISBN: 978-953-51-0304-2, InTech, Available from: http://www.intechope.,com/books/third-generation-photovoltaics/solar-spectrumconversion-for-photovoltaics-using-nanoparticles;

*A Review of Ultrahigh Efficiency III-V Semiconductor Compound Solar Cells: Multifunction Tandem, Lower Dimensional, Photonic Up/Down Conversion and Plasmonic Nanometallic Structures*, Tanabe, Energies 2009, 2, 504-530; doi:10.3390/en20300504;

*Two-Photon Photovoltaic Effect in Silicon*, Fathpour, et al, IEEE JOURNAL OF QUANTUM ELECTRONICS, VOL. 43, NO. 12, DECEMBER 2007;

*Efficient broadband near-infrared quantum cutting for solar cells*, Teng, et al, 26 Apr. 2010/Vol. 18, No. 9 OPTICS EXPRESS 9671;

*Optimal light trapping in ultra-thin photonic crystal crystalline silicon solar cells*, Mallick et al, 15 Mar. 2010/Vol. 18, No. 6/OPTICS EXPRESS 5691;

*Photonic crystal enhanced light-trapping in thin film solar cells* Zhou and Biswas, Journal of Applied Physics 103, 093102 (2008); doi: 10.1063/1.2908212;

*Light-trapping enhancement in thin film solar cells with photonic crystals*, Zhou, M S thesis, Iowa State University 2008; and

*Quasi-phase matched nonlinear media: Progress towards nonlinear optical engineering*, Pasiskevicius, et al, Optical Materials 34 (2012) 513-523.

The invention claimed is:

1. A device comprising a structure having multiple layers comprising seven stages of photon and electron gain, management, enhancement, and conversion for the purposes of photovoltaic applications, wherein, the layers are:
   1) an energy dependent up and down conversion layer optimized for a particular wavelength;
   2) a layer for multiple implementations of light capturing and trapping comprising a photonic crystal layer having photonic crystal cavities reflective of said particular wavelength and capable of producing cylindrical waveguide resonance;
3) a layer for photonic; increase and enhancement and plasmonic enhancement of captured and trapped light, wherein the photonic; increase and enhancement occurs through optical cavity resonance;
4) a layer for converting photons to electrons;
5) a layer for multiplying electrons;
6) a layer for storing generated electrons; and
7) a layer for using electrons for power; wherein the layer 3 for photonic increase and enhancement and plasmonic enhancement of captured and trapped light comprises plasmon supporting hemispheres reflective of said particular wavelength and the plasmon supporting hemispheres are present within the photonic crystal cavities.

2. The device of claim 1 wherein the device is optimized for infrared light.

3. The device of claim 1 wherein the layers are, in sequential order,
1) an energy dependent up and down conversion layer optimized for a particular wavelength;
2) a layer for multiple implementations of light capturing and trapping comprising a photonic crystal layer having photonic crystal cavities reflective of said particular wavelength and capable of producing cylindrical waveguide resonance;
3) a layer for photonic increase and enhancement and plasmonic enhancement of captured and trapped light, wherein the photonic increase and enhancement occurs through optical cavity resonance;
4) a layer for converting photons to electrons;
5) a layer for multiplying electrons;
6) a layer for storing generated electrons; and
7) a layer for using electrons for power.

4. The device of claim 1 wherein the layers are fabricated by physical vapor depositions, chemical vapor depositions, or lithography.

5. The device of claim 1 wherein layer 1 energy dependent up and down conversion layer optimized for a particular wavelength comprises PPLN or lanthanide doped glass.

6. The device of claim 1 wherein layer 2 for multiple implementations of light capturing and trapping comprises porous silicon.

7. The device of claim 1 wherein layer 3 for photonic increase and enhancement and plasmonic enhancement of captured and trapped light is a dielectric layer.

8. The device of claim 1 wherein layer 3 for photonic increase and enhancement and plasmonic enhancement of captured and trapped light comprises a matrix interspersed with the plasmon supporting hemispheres.

9. The device of claim 8 wherein the matrix is a semiconductor matrix.

10. The device of claim 8 wherein the plasmon supporting hemispheres comprise metal, nanoparticles, core/shell resonant light absorption and scattering materials or other materials capable of producing plasmons.

11. The device of claim 1 wherein any of layers 3-7 comprise a semiconductor.

12. A device comprising a structure having multiple layers comprising seven stages of photon and electron gain, management, enhancement, and conversion for the purposes of photovoltaic applications, wherein, the layers are:
1) an energy dependent up and down conversion layer optimized for a particular wavelength;
2) a layer for multiple implementations of light capturing and trapping comprising photonic crystal cavities reflective of said particular wavelength in combination with photonic increase and enhancement and plasmonic enhancement of captured and trapped light, wherein the photonic increase and enhancement occurs through optical cavity resonance;
3) a layer for converting photons to electrons;
4) a layer for multiplying electrons;
5) a layer for storing generated electrons; and
6) a layer for using electrons for power; wherein the layer for multiple implementations of light capturing and trapping comprising photonic crystal cavities reflective of said particular wavelength in combination with photonic increase and enhancement and plasmonic enhancement of captured and trapped light comprises plasmon supporting hemispheres reflective of said particular wavelength and the plasmon supporting hemispheres are present within the photonic crystal cavities.

13. A device comprising a structure having multiple layers comprising seven stages of photon and electron gain, management, enhancement, and conversion for the purposes of photovoltaic applications, wherein, the layers are:
1) an energy dependent up and down conversion layer optimized for a particular wavelength;
2) a layer for multiple implementations of light capturing and trapping comprising a photonic crystal layer having photonic crystal cavities reflective of said particular wavelength;
3) a layer for photonic increase and enhancement and plasmonic enhancement of captured and trapped light, wherein the increase and enhancement occurs through optical cavity resonance;
4) a layer for converting photons to electrons;
5) a layer for multiplying electrons;
6) a layer for storing generated electrons and for using electrons for power; wherein the layer 3 for photonic increase and enhancement and plasmonic enhancement of captured and trapped light comprises plasmon supporting hemispheres reflective of said particular wavelength and the plasmon supporting hemispheres are present within the photonic crystal cavities.

14. The device of claim 1 wherein the photonic crystal cavities reflective of said particular wavelength comprise nanoholes.

15. The device of claim 1 wherein the optical cavity resonance comprises cylindrical waveguide and cavity resonance.

16. A device comprising a structure having multiple layers comprising seven stages of photon and electron gain, management, enhancement, and conversion for the purposes of photovoltaic applications, wherein, the layers are:
1) an energy dependent up and down conversion layer optimized for a particular wavelength;
2) a layer for multiple implementations of light capturing and trapping comprising reflective photonic crystal cavities;
3) a layer for photonic increase and enhancement and plasmonic enhancement of captured and trapped light, wherein the photonic increase and enhancement occurs through optical cavity resonance;
4) a layer for converting photons to electrons;
5) a layer for multiplying electrons;
6) a layer for storing generated electrons; and
7) a layer for using electrons for power; wherein the layer 3 for photonic increase and enhancement and plasmonic enhancement of captured and trapped light comprises plasmon supporting hemispheres reflective of said particular wavelength and the plasmon supporting hemispheres are present within the photonic crystal cavities.

17. The device of claim 1 wherein said energy dependent up and down conversion layer optimized for a particular wavelength is reflective of said particular wavelength.

* * * * *